(12) United States Patent
Shimoi et al.

(10) Patent No.: US 8,802,544 B2
(45) Date of Patent: Aug. 12, 2014

(54) METHOD FOR MANUFACTURING CHIP INCLUDING A FUNCTIONAL DEVICE FORMED ON A SUBSTRATE

(75) Inventors: Hideki Shimoi, Hamamatsu (JP); Keisuke Araki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/389,053

(22) PCT Filed: Jul. 19, 2011

(86) PCT No.: PCT/JP2011/066344
§ 371 (c)(1),
(2), (4) Date: Feb. 6, 2012

(87) PCT Pub. No.: WO2012/014716
PCT Pub. Date: Feb. 2, 2012

(65) Prior Publication Data
US 2012/0135585 A1    May 31, 2012

(30) Foreign Application Priority Data

Jul. 26, 2010 (JP) .................................. 2010-167440

(51) Int. Cl.
*H01L 21/78*    (2006.01)
(52) U.S. Cl.
USPC .................................. 438/463; 257/E21.599
(58) Field of Classification Search
CPC ........ H01L 21/78; B23K 26/00; B23K 26/04; B23K 26/38
USPC ...................................................... 438/463
See application file for complete search history.

(56) References Cited

U.S. PATENT DOCUMENTS 6,992,026 B2   1/2006   Fukuyo et al.
7,033,519 B2   4/2006   Taylor et al.
(Continued)

FOREIGN PATENT DOCUMENTS

JP    4-150212    5/1992
JP    2873937    1/1999
(Continued)

OTHER PUBLICATIONS

Andrius Marcinkevičius, "Femtosecond laser-assisted three-dimensional microfabrication in silica," Optics Letters, Mar. 1, 2001, vol. 26, No. 5, pp. 277-279.

*Primary Examiner* — Mark A Laurenzi
*Assistant Examiner* — Mounir Amer
(74) *Attorney, Agent, or Firm* — Drinker Biddle & Reath LLP

(57) ABSTRACT

A method for manufacturing a chip constituted by a functional device formed on a substrate comprises a functional device forming step of forming the functional device on one main face of a sheet-like object to be processed made of silicon; a first modified region forming step of converging a laser light at the object so as to form a first modified region along the one main face of the object at a predetermined depth corresponding to the thickness of the substrate from the one main face; a second modified region forming step of converging the laser light at the object so as to form a second modified region extending such as to correspond to a side edge of the substrate as seen from the one main face on the one main face side in the object such that the second modified region joins with the first modified region along the thickness direction of the object; and an etching step of selectively advancing etching along the first and second modified regions after the first and second modified region forming steps so as to cut out a part of the object and form the substrate.

10 Claims, 14 Drawing Sheets

(56) References Cited

U.S. PATENT DOCUMENTS

| | | | |
|---|---|---|---|
| 7,549,560 B2 * | 6/2009 | Nagai et al. | 225/2 |
| 7,763,526 B2 * | 7/2010 | Tamura et al. | 438/463 |
| 2005/0272223 A1 | 12/2005 | Fujii et al. | |
| 2007/0111390 A1 * | 5/2007 | Komura et al. | 438/113 |
| 2009/0026185 A1 * | 1/2009 | Sakamoto | 219/121.72 |
| 2009/0191666 A1 * | 7/2009 | Kumagai | 438/109 |
| 2010/0136766 A1 * | 6/2010 | Sakamoto et al. | 438/463 |
| 2010/0240159 A1 * | 9/2010 | Kumagai et al. | 438/33 |

FOREIGN PATENT DOCUMENTS

| | | | |
|---|---|---|---|
| JP | 2002-210730 | 7/2002 | |
| JP | 2004-128445 | 4/2004 | |
| JP | 2004-136358 | 5/2004 | |
| JP | 2004-160618 | 6/2004 | |
| JP | 2004-210580 | 7/2004 | |
| JP | 2004-223586 | 8/2004 | |
| JP | 2004-259846 | 9/2004 | |
| JP | 2004-304130 | 10/2004 | |
| JP | 2004-343008 | 12/2004 | |
| JP | 2004-351494 | 12/2004 | |
| JP | 2004-359475 | 12/2004 | |
| JP | 2005-74663 | 3/2005 | |
| JP | 2005-121915 | 5/2005 | |
| JP | 2005-121916 | 5/2005 | |
| JP | 2005-144586 | 6/2005 | |
| JP | 2005-144622 | 6/2005 | |
| JP | 2005-152693 | 6/2005 | |
| JP | 2005-206401 | 8/2005 | |
| JP | 2005-208175 | 8/2005 | |
| JP | 2005-294325 | 10/2005 | |
| JP | 2005-306702 | 11/2005 | |
| JP | 2005-351774 | 12/2005 | |
| JP | 2006-176355 | 7/2006 | |
| JP | 2006-290630 | 10/2006 | |
| JP | 2007-36758 | 2/2007 | |
| JP | 2007-101833 | 4/2007 | |
| JP | WO2009031534 A1 * | 3/2009 | 438/33 |
| JP | 2010-21398 | 1/2010 | |
| JP | 2010-153590 | 7/2010 | |
| JP | 2011-155069 | 8/2011 | |
| WO | 2008/146744 | 12/2008 | |

* cited by examiner

Fig.14
(a)
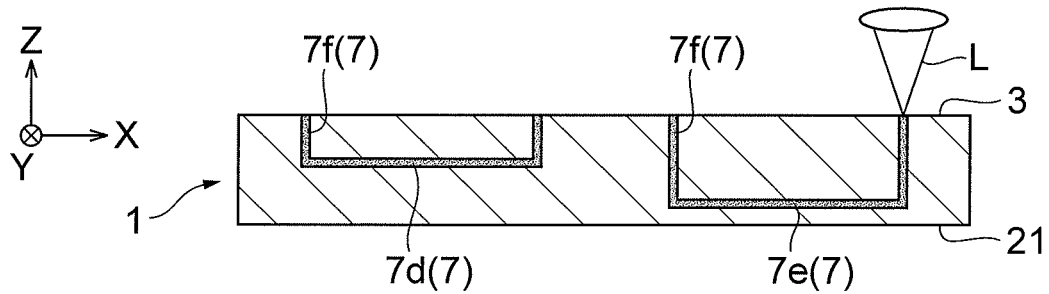
(b)
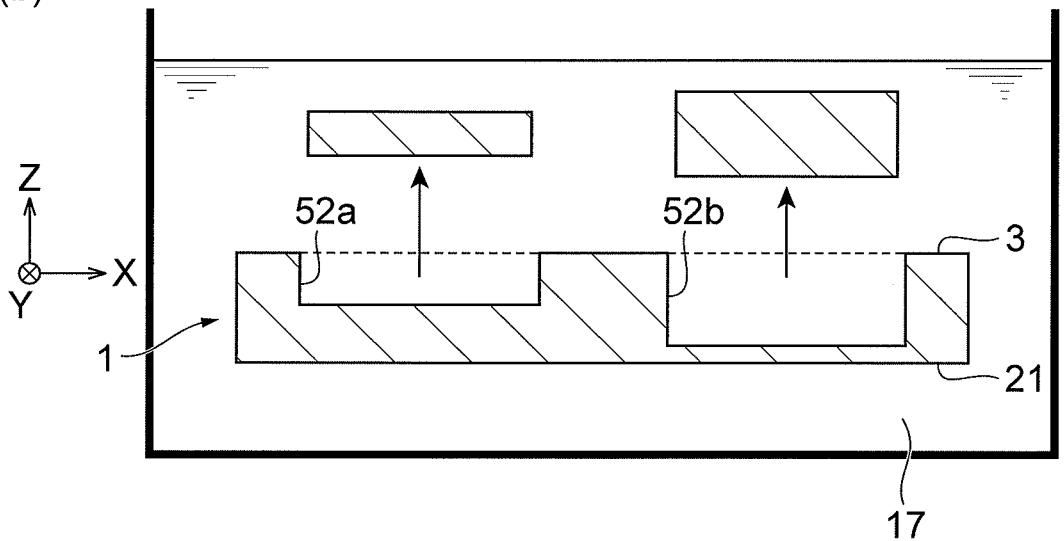
(c)
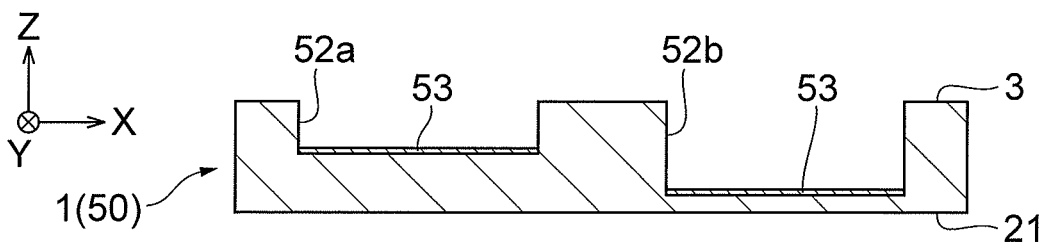

METHOD FOR MANUFACTURING CHIP INCLUDING A FUNCTIONAL DEVICE FORMED ON A SUBSTRATE

TECHNICAL FIELD

The present invention relates to a method for manufacturing a chip constituted by a functional device formed on a substrate.

BACKGROUND ART

Conventional chip manufacturing methods initially thin a sheet-like object to be processed made of silicon by polishing it to a desirable thickness required and subsequently form functional devices on one main face of the thinned object. Then, as illustrated in Patent Literature 1, for example, a laser light is converged at the object, so as to form a modified region within the object, and thereafter an external stress is applied to the object. This can cut the object into individual pieces from the modified region acting as a start point, whereby chips are obtained.

CITATION LIST

Patent Literature

Patent Literature 1: Japanese Patent Application Laid-Open No. 2004-343008

SUMMARY OF INVENTION

Technical Problem

The above-mentioned prior art thins the object by polishing it as mentioned above and thus is very hard to handle the object when manufacturing very thin chips, for example. Further, since the polished object has flexibility because of its thinness, the object is not easy to flatten when forming functional devices on the object, which also makes it hard to handle the object. Therefore, it is strongly desired for the above-mentioned prior art to be able to manufacture chips having a desirable thickness easily.

It is therefore an object of the present invention to provide a method for manufacturing a chip which can easily manufacture chips having a desirable thickness.

Solution to Problem

For achieving the above-mentioned object, the method for manufacturing a chip in accordance with one aspect of the present invention is a method for manufacturing a chip constituted by a functional device formed on a substrate, the method comprising a functional device forming step of forming the functional device on one main face of a sheet-like object to be processed made of silicon; a first modified region forming step of converging a laser light at the object so as to form a first modified region along the one main face of the object at a predetermined depth corresponding to the thickness of the substrate from the one main face; a second modified region forming step of converging the laser light at the object so as to form a second modified region extending such as to correspond to a side edge of the substrate as seen from the one main face on the one main face side in the object such that the second modified region joins with the first modified region along the thickness direction of the object; and an etching step of selectively advancing etching along the first and second modified regions after the first and second modified region forming steps so as to cut out a part of the object and form the substrate.

This chip manufacturing method forms the first and second modified regions in the object and selectively advances etching along the first and second modified regions, so as to cut out a part of the object and form the substrate. As a result, a chip having a desirable thickness is formed without thinning the object by polishing. This can make it easier to handle the object and easily manufacture chips having a desirable thickness.

There is a case where the etching step cuts out a part of the object on the one main face side as the substrate.

The first and second modified region forming steps may be performed after the functional device forming step, and the first and second modified region forming steps may cause the laser light to enter the object from the other main face on the opposite side from the one main face and converge. This can inhibit the functional device from being irradiated with the laser light when forming the first and second modified regions and thus can restrain the irradiation with the laser light from influencing the functional device (i.e., the presence of the functional device from influencing the laser beam).

The functional device forming step may be performed after the first and second modified region forming steps. This forms the first and second modified regions before forming the functional device, whereby the irradiation with the laser light becomes easier when forming the first and second modified regions.

The functional device forming step may be performed after the first modified region forming step, and the second modified region forming step may be performed after the functional device forming step. This forms the second modified region after forming the functional device and thus can inhibit the object from being cut unintentionally along the second modified region by an external force, for example, when forming the functional device.

There is a case where the etching step cuts the other main face side on the opposite side from the one main face in the object so as to thin the object and severs the thinned object along the second modified region so as to form the substrate.

Advantageous Effects of Invention

The present invention can easily manufacture chips having a desirable thickness.

BRIEF DESCRIPTION OF DRAWINGS

FIG. 14 (a) is a side sectional view of the object for explaining another embodiment, (b) is a side sectional view of the object illustrating a sequel to FIG. 14(a), and (c) is a side sectional view of the object illustrating a sequel to FIG. 14(b).

DESCRIPTION OF EMBODIMENTS

In the following, preferred embodiments of the present invention will be explained in detail with reference to the drawings. In the explanation of the drawings, the same or equivalent constituents will be referred to with the same signs while omitting their overlapping descriptions.

The chip manufacturing method in accordance with an embodiment converges a laser light into a object to be processed, so as to form a modified region. Therefore, the forming of the modified region will firstly be explained in the following with reference to FIGS. 1 to 6.

Figure 1:
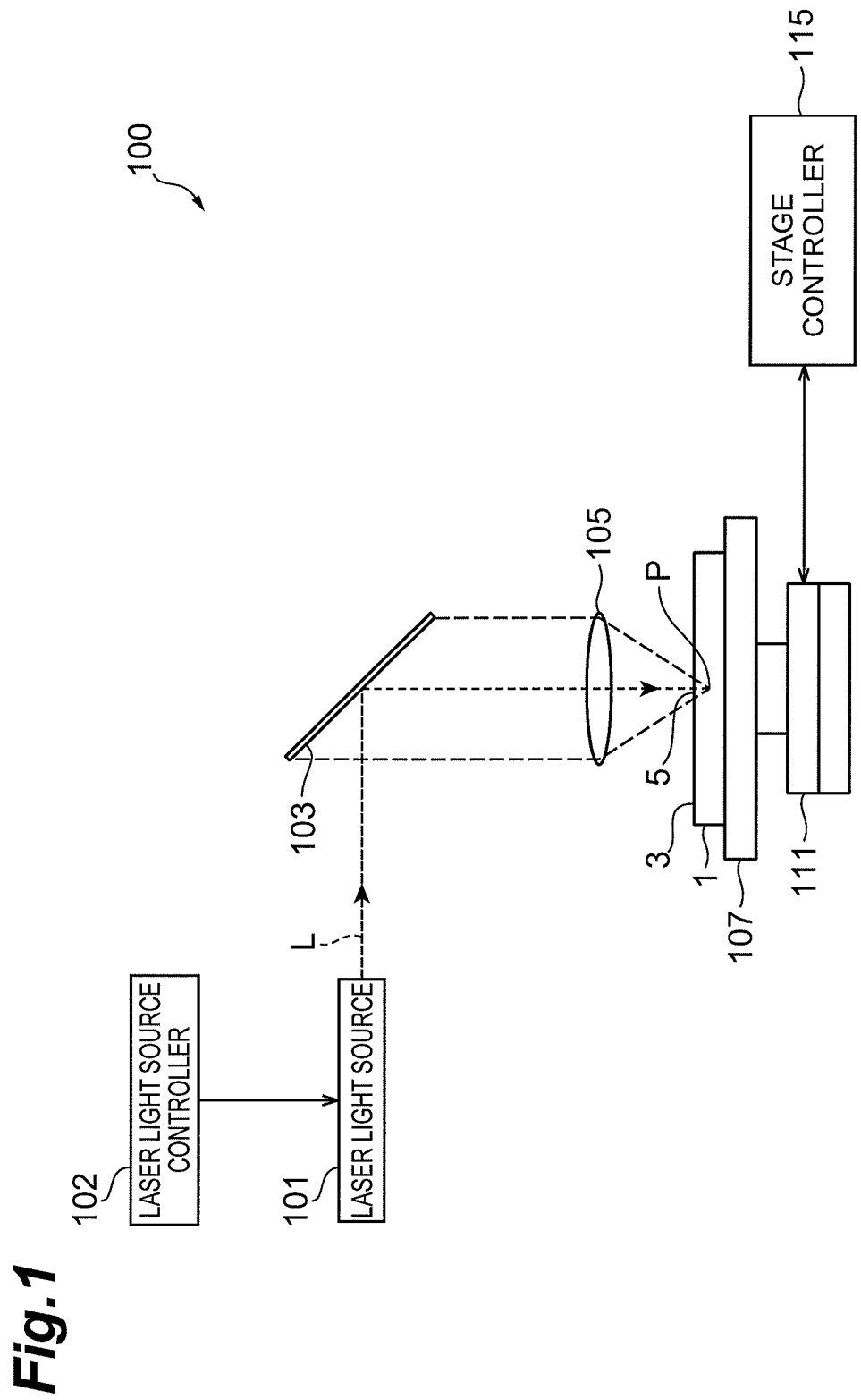
FIG. 1 is a schematic structural diagram of a laser processing device used for forming a modified region.

As illustrated in FIG. 1, a laser processing device 100 comprises a laser light source 101 which causes a laser light (processing laser beam) L to oscillate in a pulsating manner, a dichroic mirror 103 arranged such as to change the direction of the optical axis of the laser light L by 90°, and a condenser lens 105 for converging the laser light L. The laser processing device 100 also comprises a support table 107 for supporting a object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to form a modified region 5. This forms a modified region in the object 1 along the line 5.

Figure 2:
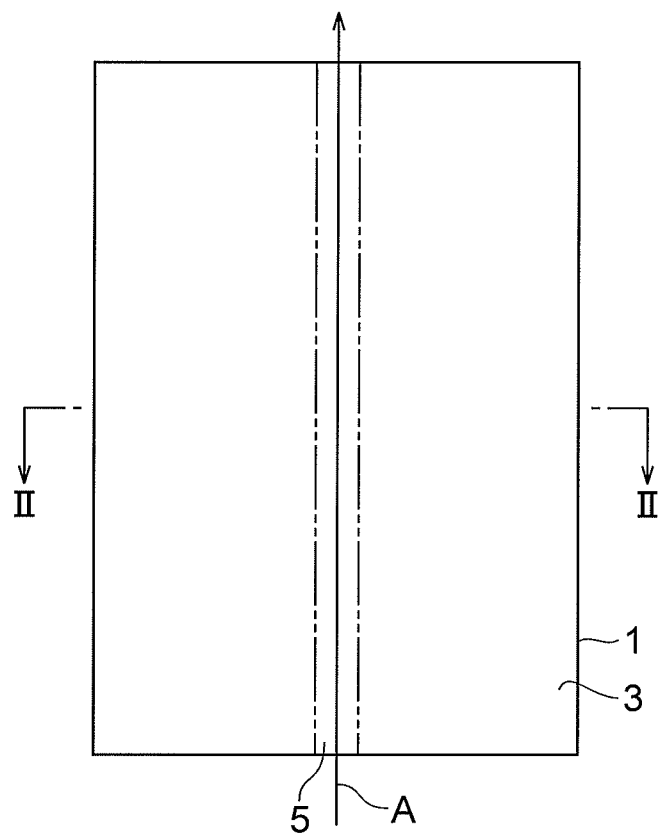
FIG. 2 is a plan view of a object to be processed in which the modified region is to be formed.
Figure 3:
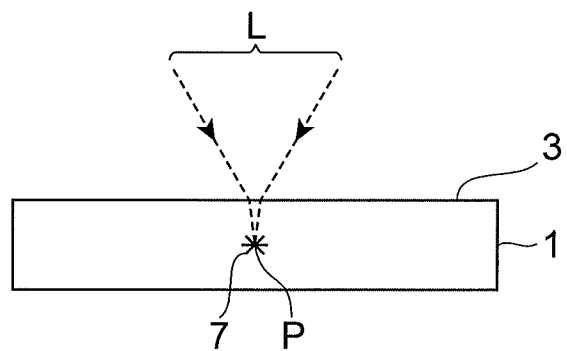
FIG. 3 is a sectional view of the object taken along the line III-III of FIG. 2.
Figure 4:
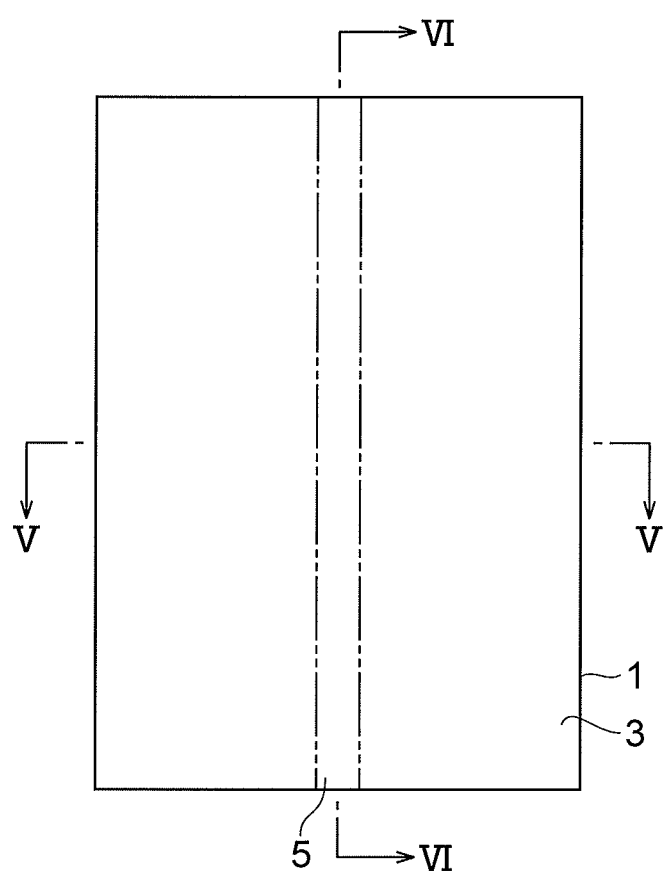
FIG. 4 is a plan view of the object after laser processing.
Figure 5:
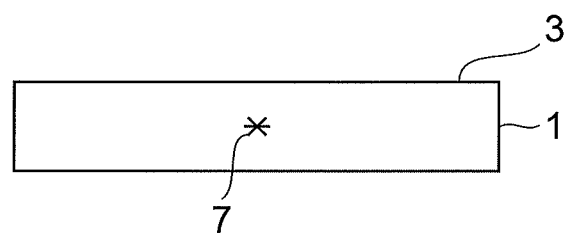
FIG. 5 is a sectional view of the object taken along the line V-V of FIG. 4.
Figure 6:
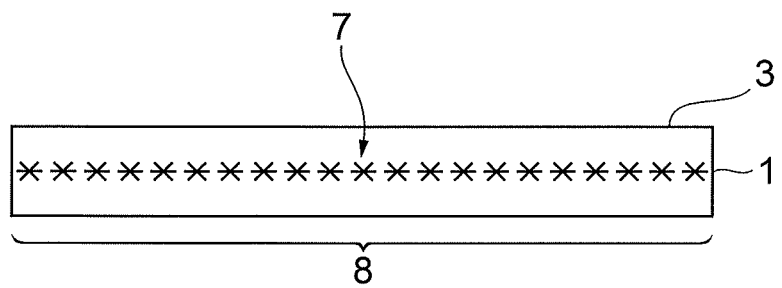
FIG. 6 is a sectional view of the object taken along the line VI-VI of FIG. 4.

As illustrated in FIG. 2, the line 5 is set in the object 1, for which a semiconductor material, a piezoelectric material, or the like is used. Here, the line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 becomes a removing region 8 to be removed by etching which will be explained later.

The converging point P is a position at which the laser light L is converged. The line 5 may be curved instead of being straight, shaped into a three-dimensional form combining them, or specified in terms of coordinates. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and side faces) of the object 1.

Here, the laser light L is absorbed in particular in the vicinity of the converging point within the object 1 while being transmitted therethrough, whereby the modified region 7 is formed in the object 1 (i.e., internal absorption type laser processing). In the case of forming a removing part such as a hole or groove by melting it away from the front face 3 (surface absorption type laser processing), the processing region gradually progresses from the front face 3 side to the rear face side in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region 7 include an area where the density has changed from that of an unmodified region in a material of the object 1 and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region 7 or in only a part or a plurality of parts thereof. Examples of the object 1 include those containing or constituted by silicon.

Here, this embodiment forms the modified region 7 in the object 1 and then etches the object 1, so as to advance the etching selectively along the modified region 7 (i.e., along the modified region 7, fractures included in the modified region 7, or fractures from the modified region 7), thereby removing a part extending along the modified region 7 in the object 1. These fractures are also known as cracks, microcracks, fractures, and the like (hereinafter simply referred to as "fractures").

In the etching in this embodiment, for example, a capillary action or the like is utilized so that fractures included in the modified region 7 of the object 1 or fractures from the modified region 7 are impregnated with an etchant, so as to advance (develop) the etching along fracture surfaces. This advances the etching selectively at a higher etching rate (etching speed) along the fractures in the object 1 and removes them. At the same time, by utilizing the characteristic feature that the etching rate of the modified region 7 itself is high, the etching is selectively advanced along the modified region 7, so as to remove it.

Examples of the etching include a case where the object 1 is immersed in the etchant (dipping) and a case where the object 1 is coated with the etchant while being rotated (spin etching). The etching herein includes isotropic etching and anisotropic etching.

Examples of the etchant include KOH (potassium hydroxide), TMAH (aqueous tetramethylammonium hydroxide solution), EDP (ethylenediamine pyrocatechol), NaOH (sodium hydroxide), CsOH (cesium hydroxide), NH$_4$OH (ammonium hydroxide), and hydrazine. The etchant to be used is not limited to liquids but may be in the form of a gel (jelly or semisolid). Here, the etchant is used at a temperature ranging from ambient temperature to about 100° C., which is set appropriately according to a required etching rate or the like. When the object 1 made of silicon is etched with KOH, for example, the temperature is preferably about 60° C.

The isotropic etching is applicable to relatively thin objects (having a thickness of 10 μm to 100 μm, for example), so that the etching can advance isotropically independent of the crystal orientation and the modified region. When a fracture is exposed to a front face in this case, the etchant travels through the fracture to wet the inside, so that the whole surface in the thickness direction becomes a start point for the modified region, whereby a chip etched such that its cut surface is depressed into a semicircular form can be taken out. On the other hand, the anisotropic etching is applicable not only to relatively thin objects but also to thick ones (having a thickness of 800 μm to 100 μm, for example). In this case, even when the surface to be formed with the modified region differs from its plane direction, the etching can be advanced along the modified region. That is, the anisotropic etching herein enables not only the etching of the plane direction in conformity to the crystal orientation, but also the etching independent of the crystal orientation.

First Embodiment

Figure 7:
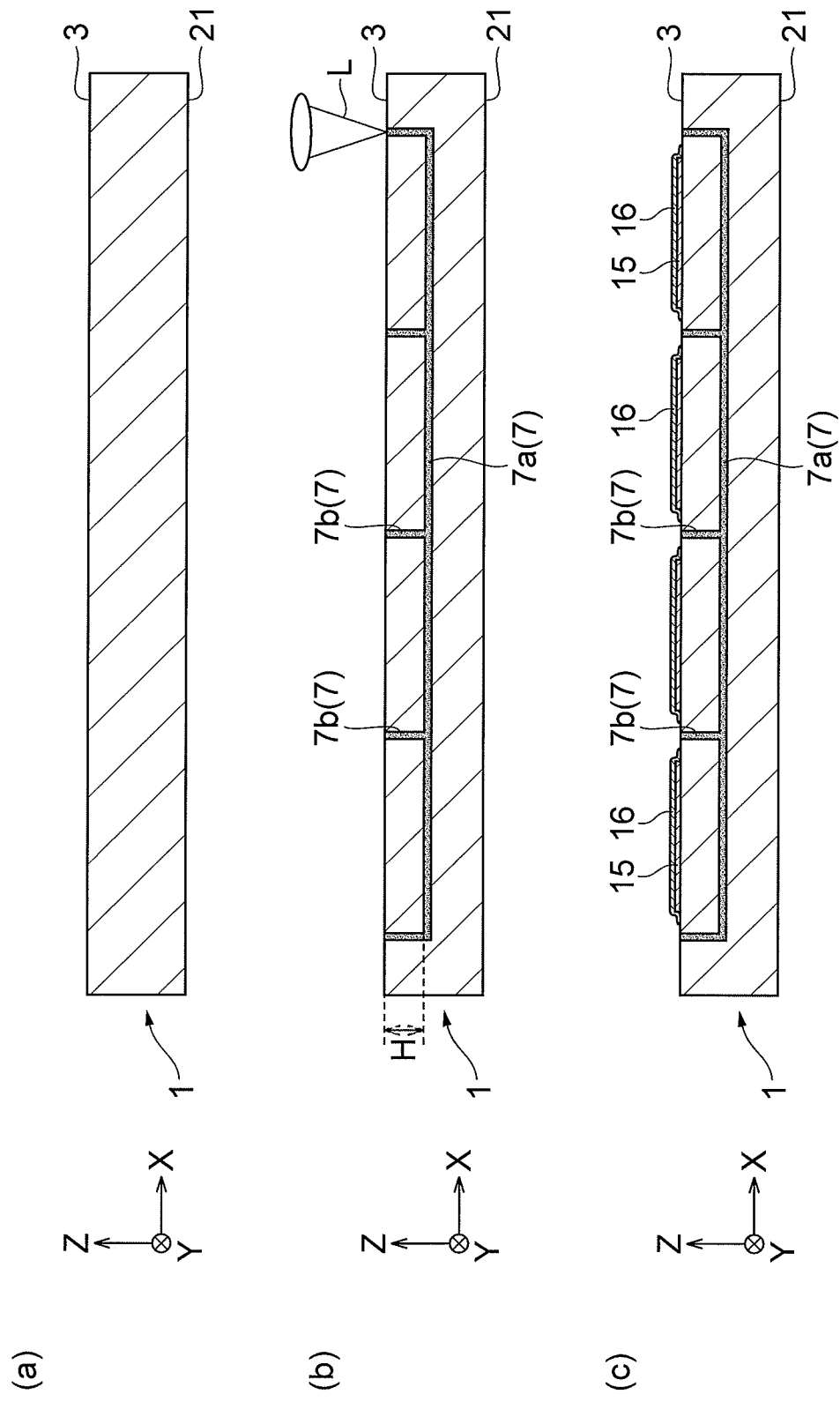
FIG. 7 (*a*) is a side sectional view of the object for explaining a first embodiment, (*b*) is a side sectional view of the object illustrating a sequel to FIG. 7(*a*), and (*c*) is a side sectional view of the object illustrating a sequel to FIG. 7(*b*)
Figure 8:
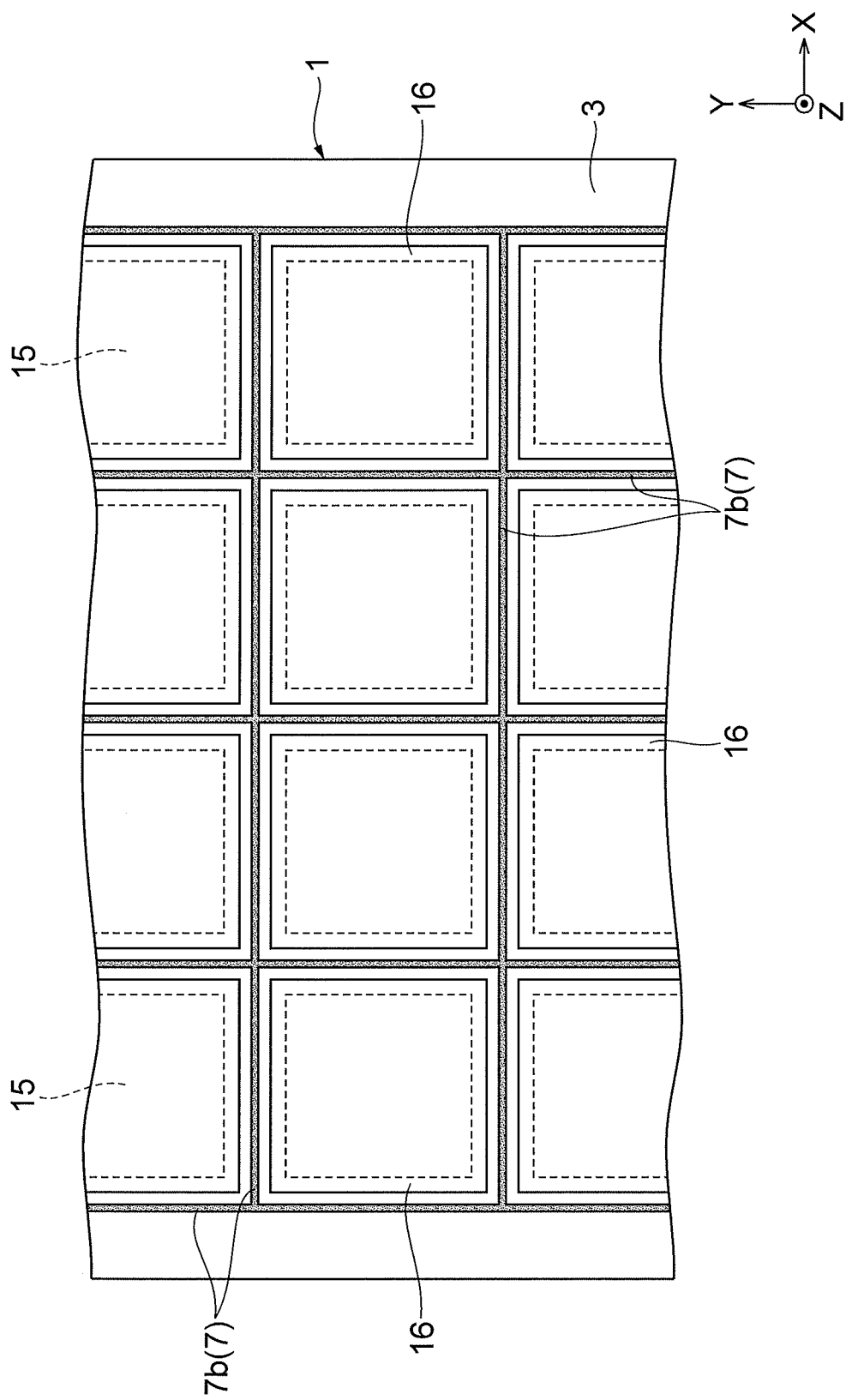
FIG. 8 is a plan view illustrating the front face side of the object of FIG. 7(*c*) under magnification.
Figure 9:
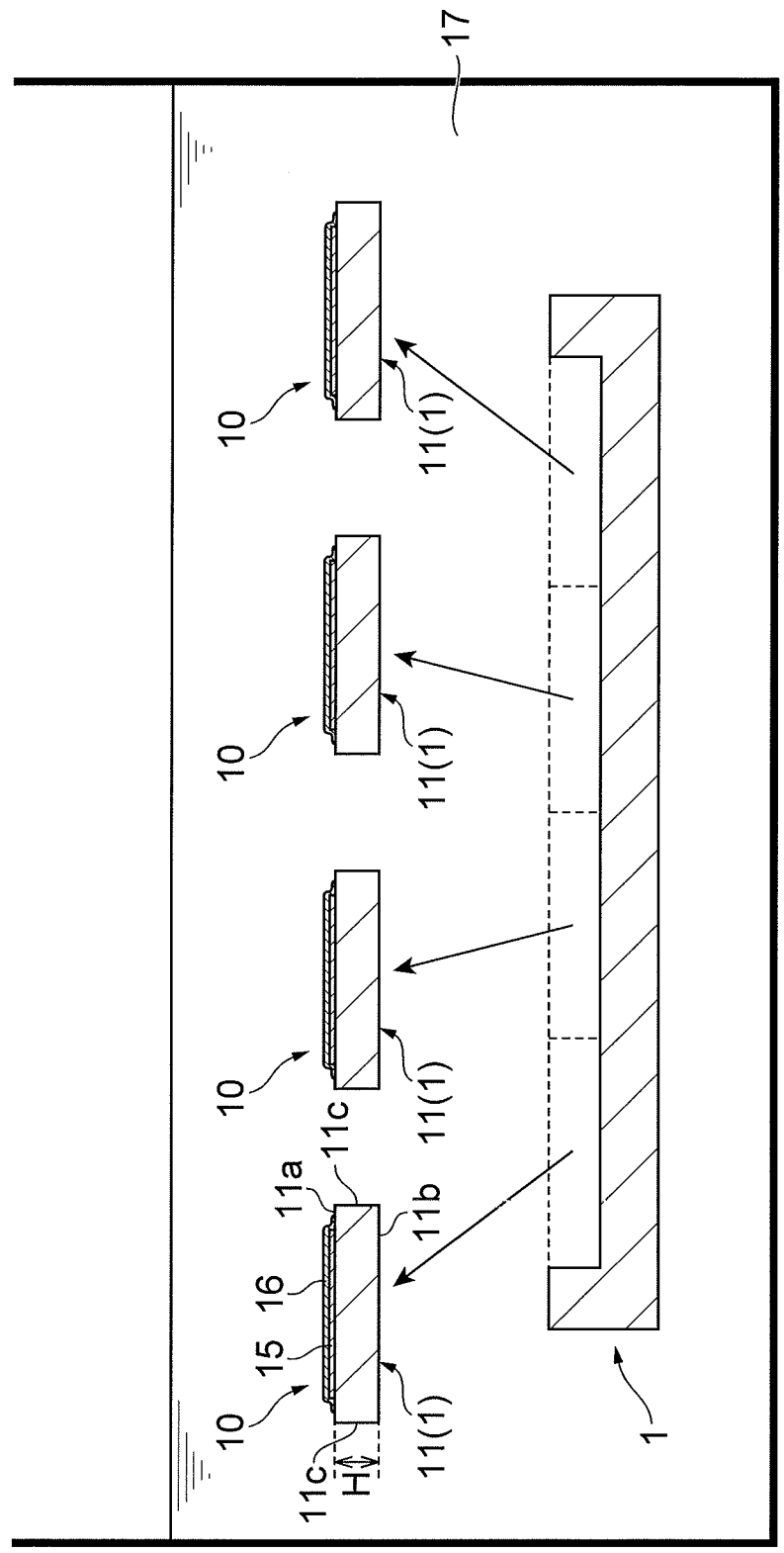
FIG. 9 is a side sectional view of the object illustrating a sequel to FIG. 7(c)

The chip manufacturing method in accordance with the first embodiment will now be explained. FIGS. 7 to 9 are flow diagrams for explaining this embodiment. As illustrated in FIGS. 7 to 9, this embodiment converges the laser light L into the object 1, so as to form modified regions 7, forms functional devices 15 and protective films 16 on a front face (one main face) 3 of the object 1, and then selectively advances etching along the modified regions 7, so as to cut out a part of the object 1 as substrates 11, thereby producing a plurality of chips 10 having a desirable thickness.

As illustrated in FIG. 9, each chip 10 is an IC chip used for an IC tag, for example, and comprises the substrate 11, the functional device 15 formed on the front face 11a of the substrate 11, and the protective film 16. The substrate 11 has an outer form shaped like a rectangular sheet with a predetermined thickness H, an example of its size being 5 mm (L)×5 mm (W)×150 μm (H) here. Examples of the functional device 15 include semiconductor operating layers formed by crystal growth, light-receiving devices such as photodiodes, light-emitting devices such as laser diodes, and circuit devices formed as circuits. The protective film 16 is an etch-resistant film such as an SiN (silicon nitride) film which is resistant to etching.

As illustrated in FIG. 7(a), the object 1 is a silicon substrate which is transparent to the wavelength (e.g., 1064 nm) of the laser light L with which it is irradiated and has a thickness of 300 μm, for example, here. The object 1 has the front face 3 and the rear face (the other main face) 21 on the opposite side from the front face 3, which are (100) planes. In the object 1, a line to form a modified region is programmably set as being specified by three-dimensional coordinates in conformity to the outer forms of the substrates 11.

As depicted, the following explanation will assume the thickness direction of the object 1 (the irradiation direction of the laser light L) to be the Z direction, one direction extending along the front face 3 of the object 1 to be the X direction, and the direction orthogonal to the X and Z directions to be the Y direction.

First, in the method for manufacturing the chips 10 in accordance with this embodiment, the object 1 is mounted and held on a mount table with the front face 3 of the object 1 facing up. Subsequently, the object is irradiated (scanned) with the laser light L incident on the front face 3 in an on/off mode while locating the converging point of the laser light L (hereinafter simply referred to as "converging point") at a predetermined thickness H from the front face 3 and moving the converging point in the X direction. This scan is repeatedly performed while changing the position of the converging point in the Y direction.

This continuously forms a modified region (first modified region) 7a along the front face 3 at a predetermined depth corresponding to the predetermined thickness H from the front face 3 in the object 1. In other words, the modified region 7a extending like a plane parallel to the front face 3 is formed at the predetermined thickness H from the front face 3 within the object 1 as one corresponding to the rear faces 11b of the substrates 11 (see FIG. 9).

The above-mentioned scan is also repeatedly performed while changing the positions of the converging point in the Y and Z directions. Consequently, as illustrated in FIGS. 7(b) and 8, modified regions (second modified regions) 7b extending such as to correspond to side edges of the substrates 11 as seen from the front face 3 and being exposed to the front face 3 are formed so as to join with the modified region 7a along the Z direction. In other words, the modified regions 7b extending like grids as seen from the front face 3 are formed along the Z direction so as to reach the predetermined thickness H from the front face 3 as those corresponding to the side faces 11c of the substrates 11 (see FIG. 9).

Since spot irradiation with a pulsed laser light as the laser light L is performed here, the resulting modified regions 7a, 7b are constituted by modified spots. The modified regions 7a, 7b and modified spots are formed such as to incorporate therein fractures generated from the modified regions 7a, 7b and modified spots (ditto in the following).

Next, as illustrated in FIGS. 7(c) and 8, a plurality of functional devices 15 are formed on the front face 3 of the object 1, and a plurality of protective films 16 are formed so as to cover the functional devices 15. Specifically, the plurality of functional devices 15 are formed into a matrix on the front face 3 such that each of them is surrounded by the grid-like modified regions 7b when seen from the front face 3. Then, the plurality of protective films 16 are laid on the functional devices 15 at such intervals that the modified regions 7b are exposed to the front face 3 between the adjacent protective films 16.

Subsequently, the object 1 is etched. Specifically, as illustrated in FIG. 9, the object 1 is immersed for about 60 min in an etchant 17, an example of which is KOH at 85° C. (so-called wet etching). This lets the etchant enter and wet the modified regions 7b from the front face 3 side, so as to advance the etching inward selectively along the modified region 7a. Then, the etchant is caused to enter and wet the modified region 7a, so as to advance the etching selectively along the modified region 7a.

As a result, the parts of the object 1 extending along the modified regions 7a, 7b are removed, so that the front face 3 side of the object 1 is cut out as a plurality of substrates 11 which are separated from each other. A plurality of chips 10 are thus manufactured as individual pieces.

In this embodiment, as in the foregoing, the modified regions 7a, 7b are formed in the object 1, and the etching is selectively advanced along the modified regions 7a, 7b, so that only necessary parts of the object 1 are cut out as the substrates 11 of the chips 10, whereby the chips 10 having a desirable thickness are formed. Therefore, this embodiment can reduce the necessity for thinning the object 1 by polishing and the like, so as to make it easier to handle the object 1, whereby the chips 10 having a desirable thickness can be manufactured easily.

Since the form and thickness of the chips 10 can easily be controlled by regulating the positions at which the modified regions 7 are formed, the chips 10 can easily be made thinner and lighter, whereby very thin chips 10, for example, can also be manufactured easily. Since the chips 10 can be separated into individual pieces without any external stress applied thereto, the object 1 can be inhibited from breaking or lowering the strength upon application of external stresses. Since no cutting dust occurs upon processing as in the case of cutting, an environment-friendly processing method can be achieved. Further, it can shorten the processing time, thereby making it possible to provide inexpensive chips 10.

In general, when the polishing thickness becomes 50 μm or less at the time of processing the object 1 by polishing, its handling may be so difficult in particular that the object 1 is likely to break during the polishing step.

In this embodiment, since the modified regions 7a, 7b are formed before making the functional devices 15, irradiation with the laser light L becomes easier when forming the modified regions 7a, 7b. Producing the functional devices 15 after forming the modified regions 7a, 7b can also inhibit the irradiation with the laser light L from adversely affecting the functional devices 15 (or the presence of the functional devices 15 from adversely affecting or restricting the laser light L) when forming the modified regions 7a, 7b.

Though this embodiment forms one modified region 7a at the predetermined thickness H from the front face 3 and the modified regions 7b extending along the Z direction and joining with the modified region 7a, this is not restrictive, whereby the modified regions 7a, 7b may be formed as follows, for example.

Figure 10:
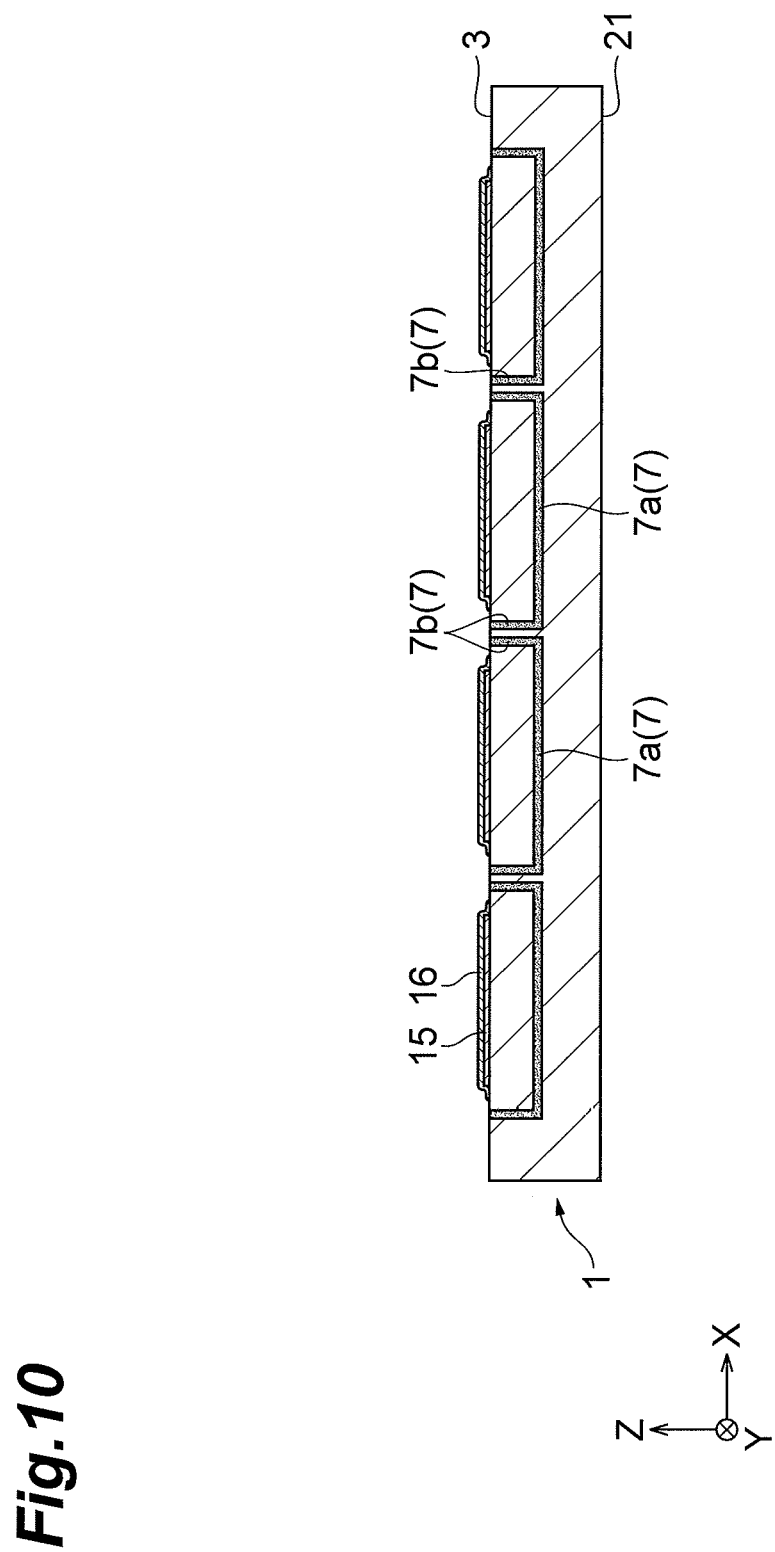
FIG. 10 is a side sectional view of the object illustrating a modified example of the embodiment.

In the example illustrated in FIG. 10, a plurality of modified regions 7a are formed at the predetermined depth H in the object 1 so as to be separated from each other. The plurality of modified regions 7a are shaped into rectangular forms corresponding to the rear faces 11b of the substrates 11 as seen from the front face 3 here. A plurality of modified regions 7b are formed such as to join with edge parts of their corresponding modified regions 7a and reach the front face 3 along the thickness direction. Here, each of the plurality of modified regions 7b is formed into a rectangular frame corresponding to the outer periphery of the substrate 11 when seen from the front face 3.

Though a plurality of chips 10 having a fixed thickness are manufactured so as to be cut out simultaneously from the object 1, this is not restrictive, whereby a plurality of chips 10 having thicknesses different from each other may be manufactured so as to be cut out simultaneously from the object 1. For example, forming the modified region 7a changing its thickness from the surface 3 stepwise so as to correspond to the individual chips 10 makes it possible to manufacture a plurality of chips 10 having desirable thicknesses different from each other from a single object 1.

Second Embodiment

The second embodiment will now be explained. This embodiment will be explained mainly in terms of differences from the above-mentioned first embodiment.

Figure 11:
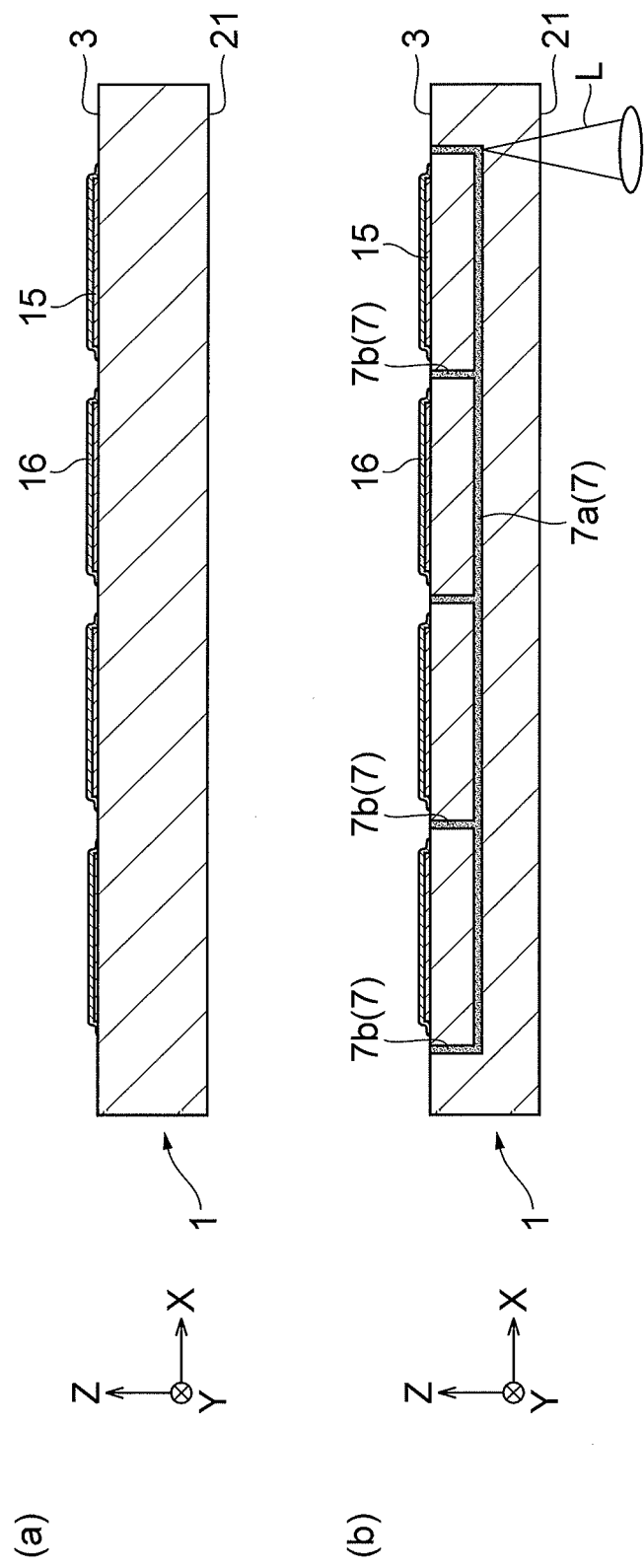
FIG. 11 (a) is a side sectional view of the object for explaining a second embodiment, while (b) is a side sectional view of the object illustrating a sequel to FIG. 11(a)

FIG. 11 is a flow diagram for explaining this embodiment. As illustrated in FIG. 11(a), this embodiment forms a plurality of functional devices 15 on the front face 3 of the object and a plurality of protective films 16 so as to cover the functional devices 15. Then, as illustrated in FIG. 11(b), the object 1 is irradiated with the laser light L from the rear face 21 while moving the converging point, so as to form the modified regions 7a, 7b.

As in the foregoing, this embodiment also yields an effect similar to that mentioned above, i.e., the effect of easily manufacturing chips 10 having a desirable thickness.

As mentioned above, this embodiment converges the laser light L while making it incident on the rear face 21 when forming the modified regions 7a, 7b and thus can restrain the functional devices 15 from being irradiated with the laser light L even when forming the modified regions 7a, 7b after making the functional devices 15, thereby inhibiting the irradiation with the laser light L from adversely affecting the functional devices 15 (or the presence of the functional devices 15 from adversely affecting or restricting the laser light L).

Third Embodiment

The third embodiment will now be explained. This embodiment will be explained mainly in terms of differences from the above-mentioned first embodiment.

Figure 12:
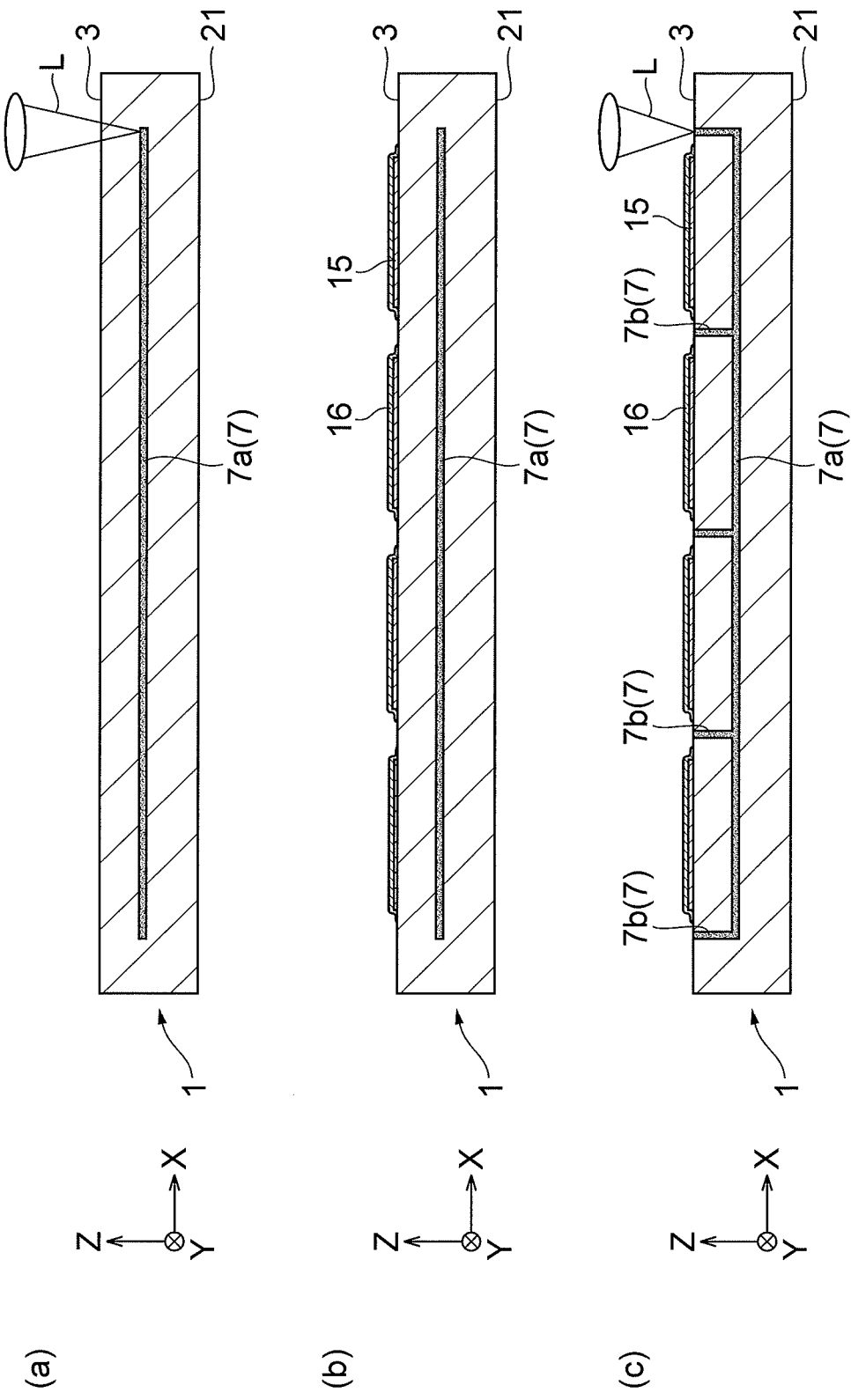
FIG. 12 (a) is a side sectional view of the object for explaining a third embodiment, (b) is a side sectional view of the object illustrating a sequel to FIG. 12(a), and (c) is a side sectional view of the object illustrating a sequel to FIG. 12(b)

FIG. 12 is a flow diagram for explaining this embodiment. As illustrated in FIG. 12(a), this embodiment converges the laser light L at the object 1 while moving the converging point, so as to form the modified region 7a. Subsequently, as illustrated in FIG. 12(b), a plurality of functional devices 15 are formed on the front face 3 of the object 1, and a plurality of protective films 16 are produced so as to cover the functional devices 15. Then, as illustrated in FIG. 12(c), the laser light L is converged at the object 1 while moving the converging point, so as to form the modified regions 7b.

As in the foregoing, this embodiment also yields an effect similar to that mentioned above, i.e., the effect of easily manufacturing chips 10 having a desirable thickness.

As mentioned above, this embodiment forms the modified regions 7b after making the functional devices 15 and thus can inhibit the object 1 from being unintentionally cut along the modified regions 7b by an external force, for example, when forming the functional devices 15. Similarly, forming the modified regions 7b after making the modified region 7a can restrain the object 1 from being unintentionally cut along the modified regions 7b when producing the modified region 7a.

Further, this embodiment can favorably attain a gettering effect by the modified region 7a, i.e., the effect of trapping and anchoring impurities of the object 1 by the modified region 7a.

Fourth Embodiment

The fourth embodiment will now be explained. This embodiment will be explained mainly in terms of differences from the above-mentioned first embodiment.

Figure 13:
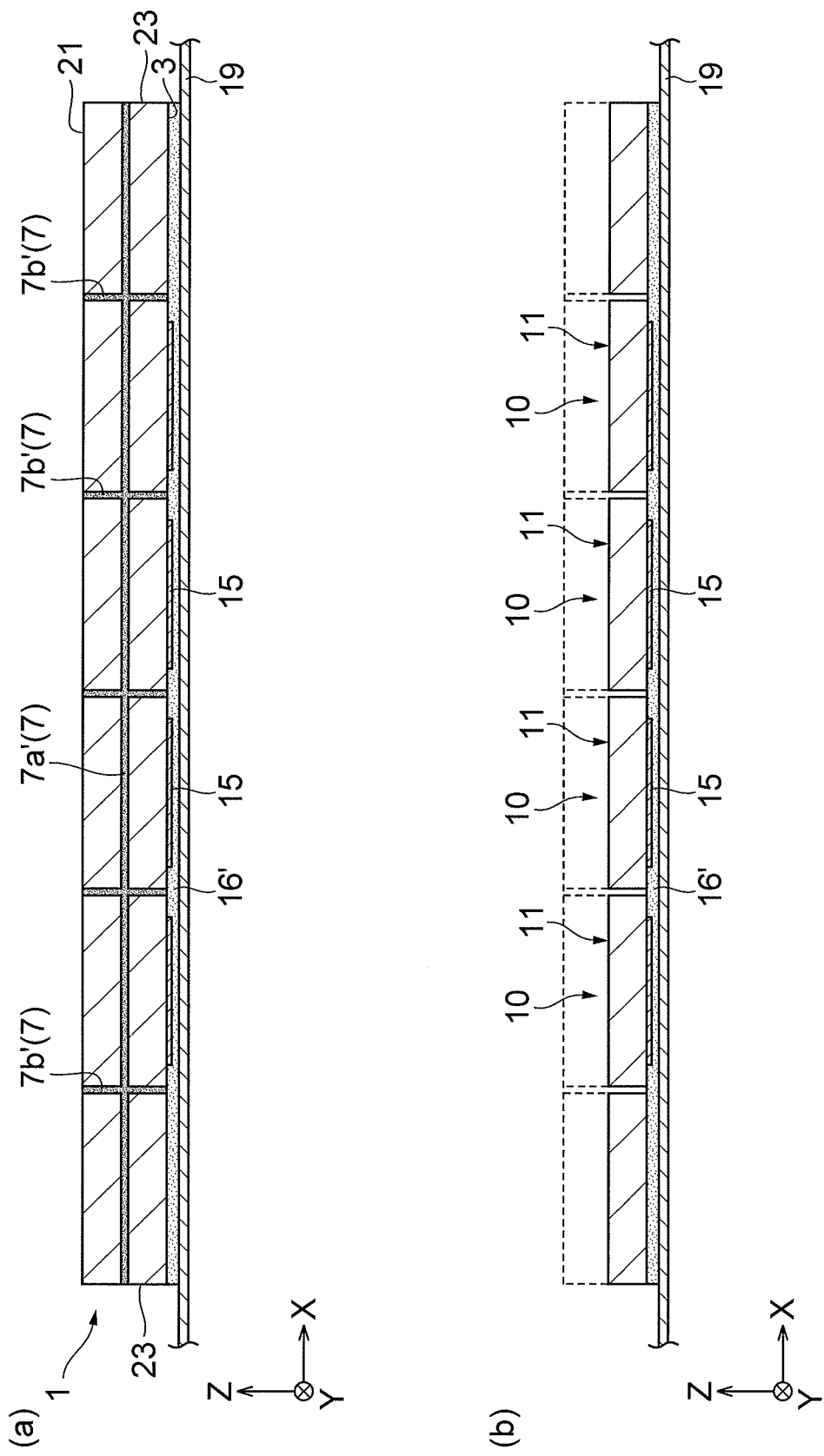
FIG. 13 (a) is a side sectional view of the object for explaining a fourth embodiment, while (b) is a side sectional view of the object illustrating a sequel to FIG. 13(a)

FIG. 13 is a flow diagram for explaining this embodiment. As illustrated in FIG. 13(a), this embodiment converges the laser light L at the object 1 while moving the converging point, so as to form modified regions 7a', 7b'.

The modified region (first modified region) 7a' is continuously formed at a predetermined depth corresponding to the predetermined thickness H from the front face 3 in the object 1 along the front face 3 so as to be exposed at a side face 23 of the object 1. Here, the modified region 7a' has a planar form parallel to the front face 3 so as to reach the side face 23 while being located at the predetermined thickness H from the front face 3 within the object 1. Here, the modified regions 7b' extend like grids when seen from the front face 3. The modified regions 7b' are formed along the Z direction such as to be exposed to the front face 3 and rear face 21 and join with the modified region 7a'.

Also, a plurality of functional devices 15 are formed on the front face 3 of the object 1, and a protective film 16' is produced so as to cover the functional devices 15. The protective film 16', which is an etch-resistant film resistant to etching, is formed throughout the front face 3 of the object 1. The object 1 is mounted and held on a tape material 19 such as an expandable tape with the rear face 21 facing up.

Subsequently, as illustrated in FIG. 13(b), the object 1 is etched. This causes the etchant to enter the modified region 7a' from the side face 23 side and the modified regions 7b' from the rear face 21 side, so as to advance the etching selectively along the modified regions 7a', 7b'. As a result, the part of the object 1 extending along the modified region 7a' is removed, so that the object 1 is cut away (cut out) and thinned on the rear face 21 side. Also, the parts extending along the modified regions 7b' in the thinned object 1 are removed, whereby the object 1 is cut into a plurality of substrates 11. Thereafter, the tape material 19 is expanded, so that the protective film 16' is cut such as to separate a plurality of chips 10 into individual pieces, whereby the plurality of chips 10 are manufactured.

As in the foregoing, this embodiment also yields an effect similar to that mentioned above, i.e., the effect of easily manufacturing chips 10 having a desirable thickness. As mentioned above, this embodiment can also manufacture the chips 10 by cutting out and thinning the object 1 on the rear face 21 side by etching alone.

Though preferred embodiments of the present invention have been explained in the foregoing, the present invention is not limited thereto but may be modified or applied to others within the scope not changing the gist recited in each claim.

For example, the laser light entrance surface for foaming the modified regions 7 is not limited to the front face 3 of the object 1, but may be the rear face 21 of the object 1. In the first, second, and fourth embodiments, any of the modified regions 7a, 7b may be formed earlier, i.e., the modified regions 7a, 7b may be formed in any order.

The on/off irradiation with the laser light L in the above-mentioned embodiments may be performed not only by controlling the on/off of the emission of the laser light L, but also by opening/closing a shutter disposed on the optical path of the laser light L or by masking on/off the front face 3 of the object 1, for example. Further, the intensity of the laser light L may be controlled between an intensity at a threshold for forming the modified region 7 (processing threshold) or higher and an intensity lower than the processing threshold.

The above-mentioned embodiments are also applicable to processing a substrate into a desirable form, for example, manufacturing a mount board 50 in which wiring layers 53 are mounted within depressions 52a, 52b of a substrate 51 as illustrated in FIG. 14.

First, in this case, the laser light L is converged at the object 1 while moving the converging point as illustrated in FIG. 14(a). This forms modified regions 7d, 7e along the front face 3 at predetermined depths corresponding to the respective depths of the depressions 52a, 52b from the front face 3 in the object 1. Also, modified regions 7f extending so as to correspond to side edges of the depressions 52a, 52b when seen from the front face 3 are formed on the front face 3 side of the object 1 so as to join with the modified regions 7d, 7e along the Z direction.

Subsequently, as illustrated in FIG. 14(b), the object 1 is etched, so as to advance the etching selectively along the modified regions 7d to 7f, thereby cutting away a part of the object 1 so as to form the depressions 52a, 52b in the object 1, and thereafter the wiring layers 53 are mounted within the depressions 52a, 52b. This can easily produce the mount board 50 in which the wiring layers 53 are formed in the depressions 52a, 52b having desirable depths and forms.

INDUSTRIAL APPLICABILITY

The present invention can easily manufacture chips having a desirable thickness.

REFERENCE SIGNS LIST

1 ... object; 3 ... front face (one main face); 7 ... modified region; 7a, 7a' ... modified region (first modified region); 7b, 7b' ... modified region (second modified region); 10 ... chip; 11 ... substrate; 15 ... functional device; 21 ... rear face (the other main face); H ... predetermined thickness (substrate thickness); L ... laser beam

The invention claimed is:

1. A method for manufacturing a chip constituted by a functional device formed on a substrate, the method comprising:
   a functional device forming step of forming the functional device on one main face of a sheet-like object to be processed made of silicon;
   a first modified region forming step of converging a laser tight at the object so as to form a first modified region parallel to the one main face of the object at a predetermined depth corresponding to the thickness of the substrate from the one main face;
   a second modified region forming step of converging the laser light at the object so as to form a second modified region extending such as to correspond to side edges of the substrate as seen from the one main face on the one main face side in the object such that the second modified region joins with the first modified region along the thickness direction of the object; and
   an etching step of selectively advancing etching along the first and second modified regions after the first and second modified region forming steps so as to cut out a part of the object and form the substrate, wherein
   the first modified region is a continuous planar region parallel to the main face of the object located at a predetermined depth measured along the thickness direction from the main face of the object,
   the second modified region is continuously formed along the thickness direction of the object so as to join with the first modified region and comprises a plurality of continuous planar regions perpendicular to the main face of the object and parallel to corresponding edges of the object and forming a rectangular frame, and
   the second modified region extends like grids as seen from the one main face.

2. A method for manufacturing a chip according to claim 1, wherein the etching step cuts out a part of the object on the one main face side as the substrate.

3. A method for manufacturing a chip according to claim 2, wherein the first and second modified region forming steps are performed after the functional device forming step; and
   wherein the first and second modified region forming steps cause the laser light to enter the object from the other main face on the opposite side from the one main face and converge.

4. A method for manufacturing a chip according to claim 2, wherein the functional device forming step is performed after the first and second modified region forming steps.

5. A method for manufacturing a chip according to claim 2, wherein the functional device forming step is performed after the first modified region forming step; and
wherein the second modified region forming step is performed after the functional device forming step.

6. A method for manufacturing a chip according to claim 1, wherein the first and second modified region forming steps are performed after the functional device forming step; and
wherein the first and second modified region forming steps cause the laser light to enter the object from the other main face on the opposite side from the one main face and converge.

7. A method for manufacturing a chip according to claim 1, wherein the functional device forming step is performed after the first and second modified region forming steps.

8. A method for manufacturing a chip according to claim 1, wherein the functional device forming step is performed after the first modified region forming step; and
wherein the second modified region forming step is performed after the functional device forming step.

9. A method for manufacturing a chip according to claim 1, wherein the etching step cuts the other main face side on the opposite side from the one main face in the object so as to thin the object and severs the thinned object along the second modified region so as to form the substrate.

10. A method for manufacturing a chip comprising a functional device formed on a substrate, the method comprising:
a functional device forming step of forming the functional device on one main face of a sheet-like object to be processed made of silicon;
a first modified region forming step of converging a laser light at the object and scanning the light in a plane parallel to the main face so as to form a first modified region that is a continuous planar region parallel to the main face of the object located at a predetermined depth measured along the thickness direction from the main face of the object;
a second modified region forming step of converging the laser light at the object and scanning the light in a plurality of planes perpendicular to the main face so as to form a plurality of second modified regions that are continuous planar regions perpendicular to the main face of the object forming a rectangular frame having edges parallel to edges of the object; and
an etching step of selectively advancing etching along the first and second modified regions after the first and second modified region forming steps so as to cut out a part of the object and form the substrate.

\* \* \* \* \*